US008326239B1

(12) United States Patent
Peiris et al.

(10) Patent No.: US 8,326,239 B1
(45) Date of Patent: Dec. 4, 2012

(54) POWER AMPLIFIER LINEARIZATION USING DIGITAL PREDISTORTION

(75) Inventors: Bemini Hennadige Janath Peiris, Sunnyvale, CA (US); Sundar G. Sankaran, Campbell, CA (US)

(73) Assignee: QUALCOMM Atheros, Inc., San Jose, CA (US)

( * ) Notice: Subject to any disclaimer, the term of this patent is extended or adjusted under 35 U.S.C. 154(b) by 497 days.

(21) Appl. No.: 12/580,709

(22) Filed: Oct. 16, 2009

(51) Int. Cl.
H04B 1/04 (2006.01)
(52) U.S. Cl. .................................. 455/114.3; 455/115.2
(58) Field of Classification Search .............. 455/114.2, 455/114.3, 115.1, 115.2; 330/149, 151, 291, 330/293
See application file for complete search history.

(56) References Cited

U.S. PATENT DOCUMENTS

| 5,049,832 | A * | 9/1991 | Cavers .......................... 330/149 |
| 7,139,534 | B2 | 11/2006 | Tanabe et al. |
| 7,184,721 | B2 | 2/2007 | Asirvatham et al. |
| 7,274,748 | B1 | 9/2007 | Khlat |
| 7,346,317 | B2 | 3/2008 | Rahman et al. |
| 7,348,844 | B2 * | 3/2008 | Jaenecke ....................... 330/149 |
| 7,542,518 | B2 * | 6/2009 | Kim et al. ...................... 375/297 |
| 7,551,686 | B1 | 6/2009 | Coons et al. |
| 7,653,147 | B2 | 1/2010 | Palaskas et al. |
| 7,653,410 | B2 | 1/2010 | Itsuki |
| 7,724,840 | B2 * | 5/2010 | McCallister et al. ......... 375/297 |
| 7,848,717 | B2 | 12/2010 | Liu |
| 7,894,844 | B2 | 2/2011 | Hiddink et al. |
| 7,899,416 | B2 * | 3/2011 | McCallister et al. ...... 455/114.3 |
| 7,940,120 | B2 | 5/2011 | Grebennikov et al. |
| 7,940,198 | B1 | 5/2011 | Velazquez |
| 8,023,588 | B1 * | 9/2011 | Benson et al. ................. 375/297 |
| 8,064,851 | B2 * | 11/2011 | McCallister ............... 455/114.3 |
| 8,150,335 | B2 * | 4/2012 | Waheed et al. ............ 455/114.3 |
| 2005/0143027 | A1 | 6/2005 | Hiddink et al. |
| 2009/0061919 | A1 | 3/2009 | Rofougaran et al. |
| 2010/0035554 | A1 * | 2/2010 | Ba et al. ....................... 455/63.1 |
| 2010/0197365 | A1 | 8/2010 | Ripley et al. |

* cited by examiner

Primary Examiner — Blane J Jackson
(74) Attorney, Agent, or Firm — Bay Area Technology Law Group PC (57) ABSTRACT

Predistortion may be employed to avoid distortion in the output of a power amplifier (PA) in a transmitter, while maintaining transmit power. An active transmission signal, instead of test tones, may be used for training a predistorter for the PA, and for the entire analog transmit path of the transmitter, via a loopback path from the output of the PA to the input of a receiver path. The transmitter may include an upconverter, and the receive path may include a downconverter, which may therefore both be included in the loopback path, helping eliminate phase noise. The predistortion training may incorporate fractional timing correction, to properly align the amplified version of the original TX signal received via the loopback path with the original TX signal. The transfer function of the PA may be estimated as a polynomial function, obtaining the coefficients of the polynomial function using adaptation techniques according to one of a number of possible different methods, e.g. through curve fitting using a least mean square (LMS) algorithm.

20 Claims, 4 Drawing Sheets

POWER AMPLIFIER LINEARIZATION USING DIGITAL PREDISTORTION

BACKGROUND OF THE INVENTION

1. Field of the Invention

This invention relates to amplifier design, and, more particularly, to the design of Power Amplifiers.

2. Description of the Related Art

Electronic amplifiers are used for increasing the power and/or amplitude of various specified signals. Most amplifiers operate by sinking current from a power supply, and controlling the output signal to match the shape of the input signal, but having a higher amplitude. Amplifiers are typically specified according to their input and output characteristics. One of the main characteristics of an amplifier is its gain, which relates the magnitude of the output signal to the magnitude of the input signal. The gain may be specified as the ratio of the output voltage and the input voltage, or the ratio of the output power and the input power. The gain relationship is oftentimes expressed as the transfer function of the amplifier. In most cases, the transfer function of an amplifier is expected to be linear, that is the gain is expected to be constant for any combination of input and output signals. While linear amplifiers responds to different frequency components independently, and do not generate harmonic distortion, nonlinear amplifiers are oftentimes affected by distortion. Overall, if the transfer function or gain is not linear, the output signal may become distorted. There are many classifications addressing different amplifier design considerations, oftentimes defining particular relationships between the design parameters and the objectives of a given circuit. Various power amplifier circuit (output stage) classifications exist for analog designs (class A, B, AB and C for example), and for switching designs (class D and E for, example) based upon the conduction angle or angle of flow, $\Theta$, of the input signal through the amplifying device—that is, the portion of the input signal cycle during which the amplifying device is conducting. The conduction angle is closely related to the amplifier power efficiency, and the image of the conduction angle may be derived from amplifying a sinusoidal signal (e.g. if the device is always on, $\Theta=360°$.) Amplifier design typically requires a compromise between numerous factors, such as cost, power consumption, device imperfections, and a large number of performance specifications.

One widely used type of amplifier is the power amplifier, or 'PA'. Power amplifiers are versatile devices that are used in various applications to meet design requirements for signal conditioning, special transfer functions, analog instrumentation, and analog computation, among others. One area where power amplifiers are typically used is in wireless applications. Such applications may feature a variety of RF (radio frequency) amplifier designs for use in the radio frequency range of the electromagnetic spectrum. RF amplifiers are oftentimes used to increase the range of a wireless communication system by increasing the output power of a transmitter.

Although it is generally desirable for the output of an amplifier to be a faithful reproduction of the input signal, as previously mentioned, this may rarely be the case due to inherent non-linearities of given amplifier designs and/or topologies. The effects of these nonlinearities may be kept to a minimum by keeping the input signal small. However, this solution is typically undesirable for power amplifiers, as it limits the output power level, and lowers the efficiency of the amplifier. One possible way to counteract distortion without having to contend with small input signals is through PA linearization techniques. One common PA linearization procedure relies on digitally predistorting the input signal to compensate for non-linearity effects. The predistorter typically manipulates both amplitude and phase of the input signal such that a predistorter stage and a PA stage cascaded together produce a linear output (except for saturation).

Figure 1:
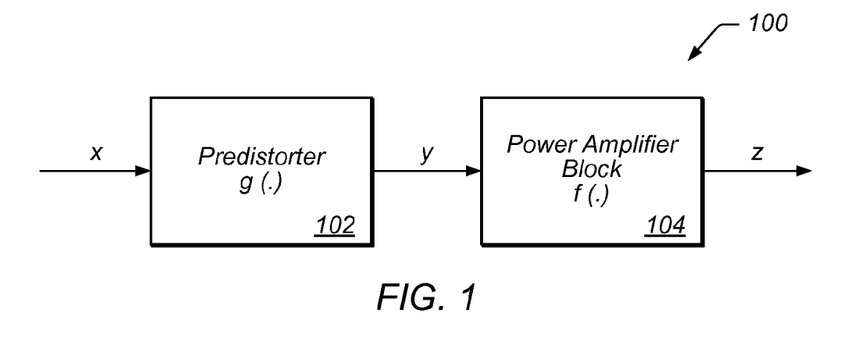
FIG. 1 is a block diagram of a cascaded configuration of a predistorter and power amplifier.

One example of a simple arrangement 100 of a predistorter and a power amplifier is shown in FIG. 1. Input signal 'x' is first fed through predistorter 102, generating a predistorted output signal 'y', which is then provided to power amplifier (PA) block 104 as the amplifier input, yielding undistorted output signal 'z'. It should be noted that PA block 104 may include system components in addition to a PA. For example, the PA in PA block 104 may be preceded by linear stages such as baseband and PA driver circuitry. Most predistortion schemes rely on obtaining a transfer function, either from a table or using other methods. Power amplifiers are typically characterized in the lab, and the predistortion coefficients are programmed into a memory. For example, the PA may be simulated to obtain the coefficients, or physical testing may be performed on actual amplifier (oftentimes configured on integrated circuit chips) to obtain the coefficients, with the assumption that all PA chips from the same series will operate as desired using those coefficients. Testing is typically performed by injecting test signals/tones, e.g. a sinewave. These methods, however, may not be adequate to meet more stringent requirements in many systems.

Other corresponding issues related to the prior art will become apparent to one skilled in the art after comparing such prior art with the present invention as described herein.

SUMMARY OF THE INVENTION

In one set of embodiments, predistortion may be employed to avoid distortion in the output signal of a transmitter, more specifically in the output signal of a power amplifier (PA) at the end of the transmitter path, while at least maintaining transmit (TX) power. In some cases, predistortion may actually operate to increase the output power to a certain extent, since it may uncompress higher signal amplitudes. An active transmission signal, instead of test tones, may be used for training a predistorter for the power amplifier (PA) and the entire analog transmit path of the transmitter (the transmit path may also be the transmit path of a transmitter/receiver, i.e. transceiver), via a loopback path from the output of the transmitter path to the input of a receiver path. The transmitter path may include an upconverter of the transmitter, and the receive path may include a downconverter. The transfer function of the PA may be estimated as a polynomial function, obtaining the coefficients of the polynomial function using adaptation techniques according to one of a number of possible different methods. In one set of embodiments, the coefficients of the polynomial function may be obtained through curve fitting using a least mean square (LMS) algorithm.

The predistortion coefficients, thereby obtained, may then be used for performing predistortion to correct for potential non-linearities in the PA output due to the inherent non-linearities of the PA. By using a feedback loop that includes both the upconverter and the downconverter using a same oscillator, phase noise added by the upconverter may be cancelled by the downconverter. Consequently, there may be no need to use separate paths for incorporating the upconverter and downconverter. The predistortion training and operation may also incorporate fractional timing correction, to properly align the received version of the original TX signal with the original TX signal. Effectively time aligning the input and output of the PA (which is in the transmit path of the transmitter) may allow for accurate evaluation of the PA transfer function. Therefore, the loopback path may be used to eliminate phase error (noise), and the fine timing alignment provided by the fractional timing correction may ensure further accuracy of the PA output signal or the accuracy of the PA transfer function.

During a training phase, an input signal, which may be a regular transmission signal, e.g. an OFDM (Orthogonal Frequency-Division Multiplexing) signal, may be provided to the transmitter where it may bypass the PA Predistorter, since the training phase is carried out to obtain the characteristics of the PA. In some cases, the PA Predistorter may remain enabled during the training phase, in which case signals that do not violate the spectral mask may be transmitted. During the training phase, the PA and all analog stages in front of the PA may be modeled as a single transfer function. The input signal (OFDM signal) may pass through the baseband analog stages and may be upconverted by a mixer before being provided to the PA. At this point the resultant signal, or output signal, which would normally be transmitted by the antenna, may be fed back through the loopback path into a receiver path configured in the transmitter. It should be noted, that in some embodiments the transmitter may actually be a transceiver, and the receive path may be part of a receive stage of the transceiver.

The output signal of the transmitter stage may thereby become the input signal to a receiver stage in the transmitter. The signal into the RX stage may be downconverted, and passed through an ADC (analog-to-digital converter), which may properly size the signal to avoid a low signal volume in order to avoid noise becoming a dominant factor, and further to avoid very high signal volumes in order to avoid signal clipping at the ADC output. A properly sized signal may therefore be obtained. Sampling may be performed at a frequency specified depending on design considerations. In one embodiment, sampling in the RX path is performed at a lower frequency than the transmitter frequency. For example, if the transmitter frequency is 160 MHz, the sampling frequency in the RX path may be 80 MHz, which would be equivalent to a 25 nsec sampling time, yielding 1-nsec accuracy. The 80 MHZ signal may be upsampled by 8× or 16×.

Respective transformation blocks, e.g. CORDIC (Coordinate Rotation Digital Computer, which is a simple and efficient algorithm useable to calculate hyperbolic and trigonometric functions) blocks may be used to obtain amplitude and phase information representative of the original input signal and the received signal, respectively, by converting Cartesian coordinates of the two signals to respective sets of polar coordinates. The respective sets of amplitude and phase information from the transmission signal (input signal) and received signal may be used to obtain the transfer function between the received signal (amplitude) and the transmitted signal (amplitude), which may provide the PA characteristics (including the phase characteristics). The training phase may be performed for each and every gain setting. In one set of embodiments, the training may be performed for one (e.g. highest) gain setting, and pre-scaling and post-scaling may be introduced at the Predistorter block to cover the rest of the analog gain settings. In such cases, the PA may only have a single gain setting—which may be the case for most PAs—and the analog blocks configured in front of the PA may be linear and may have variable gain. Coefficients thus obtained may be used for predistorting the signal during actual transmission.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Figure 2:
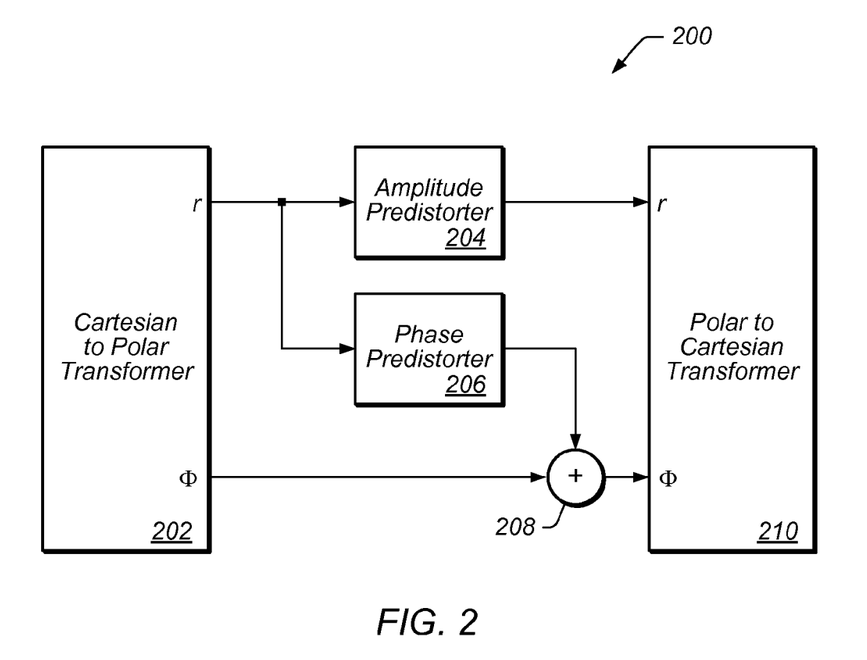
FIG. 2 is a high-level block diagram of one embodiment of the predistorter of FIG. 1.

Various embodiments of a transmitter or transceiver that use a power amplifier (PA) for signal transmission may include a predistortion circuit (predistorter) for predistorting the signal to be transmitted prior to the digital-to-analog conversion, in order to compensate for potential non-linearities in the PA output. A non-linearity may manifest itself in an amplifier as an amplitude-dependent gain. That is, the gain of the amplifier may be typically lower for higher amplitude signals than for lower amplitude signals. This is commonly referred to as amplitude distortion. To compensate for amplitude distortion, a predistorter (e.g. in FIG. 1) may be configured to pre-emphasize/amplify higher amplitude signals to ensure that the overall gain—of the predistorter stage and the amplifier stage as a whole—remains the same regardless of the amplitude of the input. In addition to amplitude distortion, the amplifier's output may be also affected by phase distortion. The phase distortion may manifest itself as an amplitude-dependent phase shift. The predistorter (e.g. in FIG. 1) may also be configured to introduce a negative (opposite) of the phase shift introduced by the amplifier, such that the overall phase shift—of the predistorter stage and the amplifier stage together—is zero. This may ensure that the overall phase shift is constant regardless of the amplitude. FIG. 2 shows a block diagram of one embodiment of an amplitude and phase predistorter 200. In order to predistort the signal correctly, predistorter 200 may be provided with information representative of the amplitude and phase distortion introduced by the amplifier. Predistorter 200 may be configured to obtain or acquire this information during a training phase. The predistorter may receive the transmit (TX) signal in Cartesian format (I+jQ) at Cartesian to polar transformer 202, and generate a magnitude/amplitude (r) and a phase ($\Phi$) representative of the TX signal. The amplitude and phase may be predistorted in amplitude predistorter 204 and phase predistorter 206, respectively, based on the information estimated during the training phase. The predistorted magnitude output from amplitude predistorter 204 and the predistorted phase output from phase predistorter 206 may be converted to Cartesian coordinates in polar to Cartesian transformer 210. Predistorter 200 may use a polynomial model corresponding to the transfer function of the PA to determine how its gain and phase shift should be varied as a function of the input amplitude. The coefficients of the polynomial may be estimated during a training phase of predistorter 200, using one of a variety of possible adaptation techniques. While there are many different ways to estimate the coefficients, performing curve fitting using a least-mean square (LMS) algorithm may be a preferred approach due to its reduced complexity and ease of implementation. However, in alternative implementations, the coefficients (corresponding to the estimated transfer function of the PA) may be obtained through other methods, for example through a novel table lookup method using a binning technique, which may include binning the output values, finding the small signal gain, and multiplying by the small signal gain to perform the interpolation. This method is described in further detail in co-pending U.S. patent application Ser. No. 12/580,836 titled "Power Amplifier Linearization System and Method", whose inventors are Bemini Hennadige Janath Peiris, and Sundar Sankaran.

At the time the transmitter is powered on, the predistorter may need to learn how to distort (pre-emphasize or predistort) the TX signal to yield a substantially linear signal at the overall output of the cascaded system that includes the predistorter and the PA (e.g. in FIG. 1). This learning period may be referred to as the predistorter training. The training may have to be repeated periodically since the PA (distortion) characteristics may vary with temperature and/or time. During the predistorter training, the desired predistorter polynomial coefficients may be estimated based on a reference (digital) input signal, which may be the actual TX signal—prior to its being converted to analog, upconverted to RF band, and provided to the PA—, and the digitized PA output, which may be looped back to a receiver path and downconverted to baseband. The loop-back path established between the output of the transmitter stage and the input of a receiver stage facilitates obtaining the digitized PA output. The number of samples used for training may be programmable. A set of coefficients may be maintained for each transmitter gain setting. Depending on the gain setting used for a current packet, the LMS algorithm may adapt the appropriate set of coefficients. Upon completion of training, the coefficients may be copied to the predistorter in the transmitter path.

Figure 3:
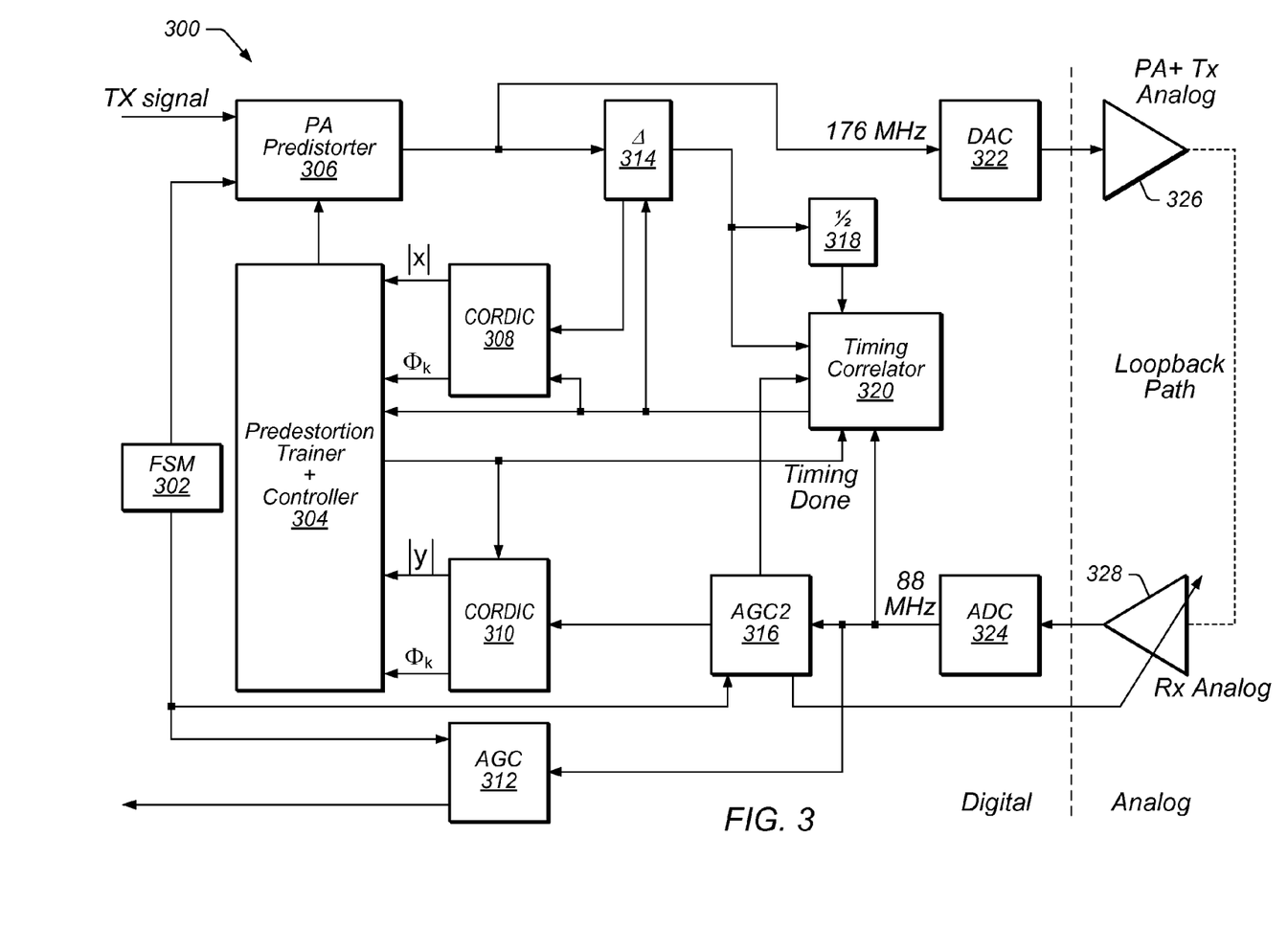
FIG. 3 is a partial block diagram of one transmitter that includes a predistorter scheme.

FIG. 3 is a partial logic diagram of one embodiment of a transmitter 300 (which may also be a transceiver) configured to operate with minimal distortion. Transmitter 300 may include a predistortion trainer and controller block (PTC) 304, and logic, which may be a finite state machine (FSM) 302, to provide predistortion functionality. FSM 302 may operate to configure predistorter 306, which may receive information and control data from PTC 304, determined during a training phase of predistorter 306. As shown in FIG. 3, during the training phase, a regular transmission (TX) signal, which may be an OFDM (Orthogonal Frequency-Division Multiplexing) signal, may be provided through a delay block 314 back into a CORDIC (Coordinate Rotation Digital Computer) block 308 to generate magnitude and phase information based on the TX signal, and thereby representative of the TX signal, prior to the TX signal being converted to an analog signal by DAC 322. The amplitude and phase information representative of the TX signal may then be provided to PTC block 304. The TX signal may also travel through the transmit path in transmitter 300, which includes a transmission stage 326 (including a TX PA and other analog components, such as an upconverter, not explicitly shown in FIG. 3 but present in FIG. 4). The PA output from transmission stage 326 is the signal that would be transmitted under regular operation of transmitter 300, and it may be looped back to the receive (RX) stage 328 of transmitter 300. The loopback path may be established during the training phase, and may be disabled in normal transmission mode. Using the TX signal as the RX signal—the signals respectively traveling through the transmit path and the receive path—may allow the downconverter (part of RX stage 328) to eliminate phase noise added by the upconverter (part of TX stage 326), as will be further described below.

Accordingly, during the training phase, the RX signal may be provided through an automatic gain control (AGC2) block 316 to its respective CORDIC 310, which may generate the amplitude and phase information representative of the RX signal, and make the amplitude and phase information available to PTC 304. PTC 304 may then compare the respective amplitude and phase information of the two signals, i.e. compare the amplitude and phase information representative of the TX signal to the amplitude and phase information representative of the RX signal, respectively. The TX signal may be considered a 'before' signal in the sense that it represents the TX signal before it enters the transmit path via DAC 322, and consequently before it enters the TX PA. Similarly, the RX signal may be considered the 'after' signal in the sense that it represents the original TX signal but after it has traveled through the transmit path, exited the TX PA, and looped back through the receive path where it has been digitized by ADC 324. PTC 304 may obtain the coefficients for predistorter 306 based on the comparison of the two signals, and provide those coefficients to PA predistorter 306. As previously outlined, the coefficients determined/obtained by PTC 304 may then be used in predistorter 306 (which may be similar to the embodiment shown in FIG. 2) to predistort the amplitude and phase of the TX signal during regular transmissions. It should be noted that AGC2 316 may be used to size the signal only during the predistorter training, and sizing of an actual RX signal during regular transmission may be performed through AGC 312.

In one set of embodiments, the loopback path may be configured on the same integrated circuit (chip) as transmitter 300, and may be switchably established between the TX PA output and the RX input. In embodiments where the PA is external to predistortion circuit 306, the loopback may be established outside the chip. The loopback path is meant to be established during training, and may be disconnected thereafter to allow transmitter 300 to perform regular transmission of signals, or in case of a transceiver 300, to perform regular transmission and reception of signals. Those skilled in the art may appreciate that there are a variety of ways by which the loopback path may be established, and that FIG. 3 is illustrative of the general principle of establishing a loopback path between the TX stage 326 and RX stage 328.

Figure 4:
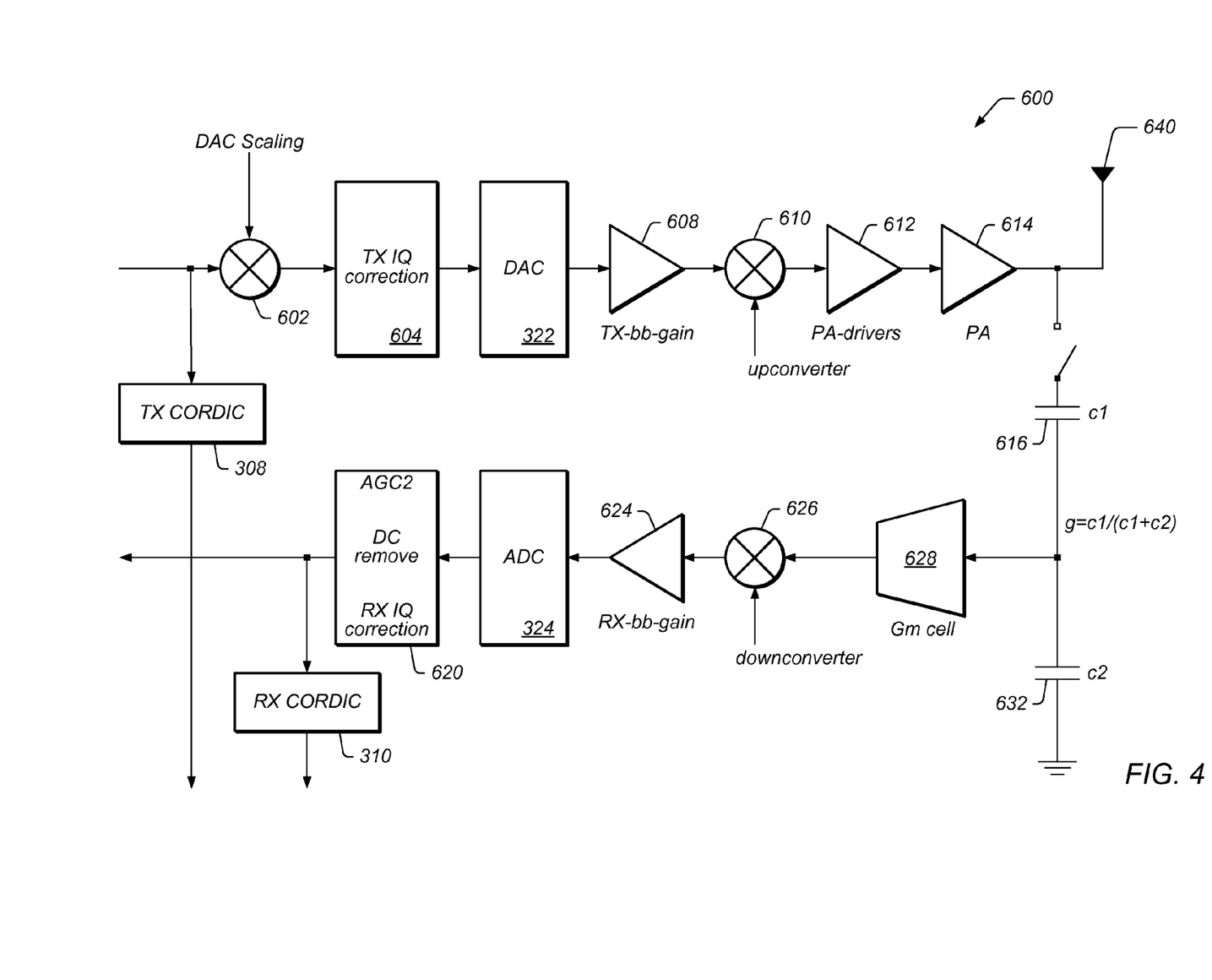
FIG. 4 is a partial block diagram of one embodiment of the transmitter path and receiver path of the transmitter of FIG. 3.

FIG. 4 shows one embodiment of a more detailed block diagram of the TX stage and the RX stage of transmitter 200. During the training phase, predistorter 306 may be turned off, and the TX signal may pass through the predistorter without being predistorted, into scaling element 602, where it may be scaled in preparation of the digital-to-analog conversion. The scaled signal may then proceed through an IQ correction block 604 configured to perform IQ (quadrature) imbalance correction for imbalances between the I-channel and Q-channel of a quadrature modulator (upconverter 610), which may be used to upconvert the analog baseband signal generated from the TX signal. In one set of embodiments, carrier leak correction may also be performed at this point. The corrected signal may then be converted to an analog signal by DAC 322, and gained up in amplifier 608 before being provided to upconverter 610, which may upconvert the baseband signal to an RF band signal, which may be provided to PA drivers 612. PA driver 612 may operate to provide the input into PA 614, which may be used to provide the amplified RF band signal to an antenna 640 for transmission.

As previously mentioned, during training of predistorter 306, a loopback path may be established from the output of PA 614 to the input of attenuator cell 628, to obtain a downconverted and digitized version of the RF band signal (which was generated from the original TX signal), to obtain the polynomial coefficients usable by predistorter 306 during regular operation. The loopback path may be switchably established, and may include capacitors 616 and 632, with the ratio between the input of attenuator cell 628 and the output of PA 614 may be expressed as $c1/(c1+c2)$. The output of PA 614 may thereby be coupled to the input of attenuator cell 628. The output from attenuator cell 628 may be downconverted to baseband by downconverter 626, gained up in preparation of analog-to-digital conversion, and converted to a digital RX signal by ADC 324. The digital RX signal may then go through a function block 620, which may operate to remove the DC signal component, correct for quadrature imbalance, and perform automatic gain control. As shown, the original digital TX signal may be provided to CORDIC 308, and the final RX digital signal may be provided to CORDIC 310, during the training phase, to generate the amplitude and phase information used to determine the coefficients of the polynomial corresponding to the transfer function representative of the analog section of the transmitter path.

In one set of embodiments, the predistorter training for predistorter 306 may include two stages, which may reduce hardware (HW) requirements, and timing alignment may be performed up to a specified RX frequency, e.g. 80 MHz (in the specified embodiments herein). Referring again to FIG. 3, during a first stage, a coarse alignment of the RX signal, once it has passed through AGC2 316, may be performed by Timing Correlator (TC) block 320, to the sampling time of ADC 324, which is 88 MHz in the disclosed embodiments. Once the RX signal has been coarsely aligned, TC block 320 may perform fine aligning during a second stage of the predistorter training In one embodiment, the fine aligning may be performed using an upsampled version (e.g. upsampled by 8× or 16×) of the ADC 324 output to eliminate the timing error that may affect the coarse timing alignment, in order to avoid possibly biasing the transfer function estimation. In another set of embodiments, when a table lookup method is used in determining the predistortion information instead of an LMS polynomial method, the fine aligning may be performed through banks of poly-phase filters operated at sub 88 MHz sample rates, each filter representing a step—e.g. eight stages when desiring 8× upsampling or 2 stages when desiring 2× upsampling—the correct phase selected from the filters. The output of each filter in the filter bank may be correlated to the 176 MHz TX signal, and a correct phase may be selected from these separate correlation signals. Once the signals are aligned, the coefficients for the polynomials for predistorter 306 may be determined. Coefficients may be accurately determined once the TX and RX signals have been properly aligned as best as possible.

Figure 5:
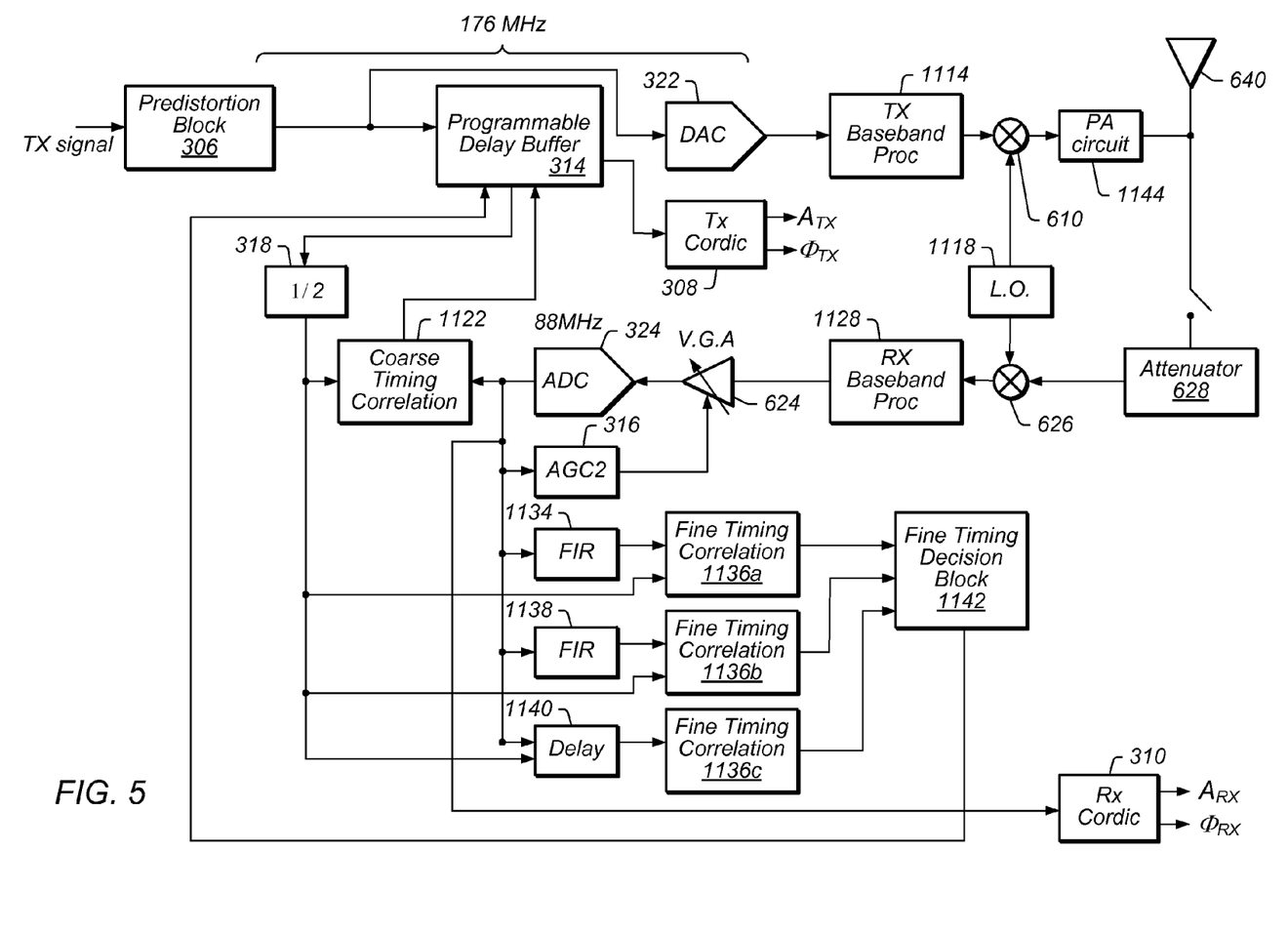
FIG. 5 is a partial block diagram of one embodiment of the time correlation block and interfacing components in the transmitter of FIG. 3.

FIG. 5 shows a more detailed diagram of certain components of transmitter 300 to highlight the timing correlation functionality that may be implemented in TC block 320 from FIG. 3. The partial block diagram in FIG. 5 shows one embodiment in which coarse timing correlation may be performed during a first stage of the predistorter training, followed by a second stage during which fine timing correlation may be performed using polyphase filters. As shown in FIG. 5, certain circuit and system components have numeric identification consistent with the numeric identifications provided for similar components in the embodiments presented in previous figures, to better illustrate the relative positions and interconnection of these components. As previously mentioned, timing correlation of the TX signal and RX signal may be performed to align the signals as best as possible to accurately evaluate the PA (or entire analog transmit path) transfer function.

During the first stage of the predistorter training, coarse timing correlation may be performed as follows. The digital TX signal may go through predistortion block 306 without being predistorted (predistorter 306 may be disabled at this time), and may bypass delay buffer 314 as it also does during regular operation to enter DAC 322, where the signal may be converted to an analog baseband signal. The analog baseband signal may then be processed in function block 1114, and upconverted to RF band by upconverter 610, then amplified by PA circuit 1144 (which may include PA drivers 612 and PA 614, as seen in FIG. 4). The output of PA circuit 1144 is the transmitted signal, which under regular operating conditions may be provided to antenna 640 for transmission. However, during predistorter training, the signal may be looped/switched back into attenuator 628 in the receiver path. For coarse timing correlation, the digital TX signal may be downsampled by a specified factor, in this case 2 (block 318), to provide a reference to the RX signal obtained at the output of ADC 324. In the example shown, the sampling frequency for DAC 322 may be a first frequency, 176 MHz, while the sampling frequency for ADC 324 may be a second frequency that is a fraction of the first frequency, specifically one-half of 176 MHz, i.e. 88 MHz. As part of the first stage of the predistorter training, the TX signal may eventually be delayed based on the results of the coarse timing correlation through programmable delay buffer 314, before entering TX Cordic block 308.

As seen in FIG. 5, the same local oscillator (LO) 1118 may be used by upconverter 610 and downconverter 626, at least partially making it possible to eliminate phase errors through the loopback path. The attenuated analog RF band RX signal may then be downconverted to an analog baseband signal, which may be processed in block 1128, then amplified by variable gain amplifier (VGA) 624, whose gain may be modified through automatic gain control (AGC) block 316. The amplified analog baseband signal may then be converted to the digital RX signal by ADC 324 operating at the second (sampling) frequency of 88 MHz. The digital RX signal may then be correlated with the downsampled digital TX signal in block 1122. Once coarse timing correlation (e.g. up to ½ of the ADC sampling time) has been performed, block 1122 may appropriately program delay buffer 314 to delay the TX signal according to the result of the coarse correlation operation.

Once coarse timing correlation has been performed and the TX signal entering DAC 322 has been delayed accordingly, fine timing correlation may be performed (e.g. up to ¼ of the ADC sampling time—it should also be noted that in other embodiments, fine timing correlation may be performed up to a finer resolution than ¼ of the ADC sampling time, when evaluating the PA transfer function as a polynomial with coefficients determined using an LMS algorithm, for example), during the second stage of predistorter training Delaying the TX signal into TX Cordic block 308 effectively matches the delay of the RX signal that appears at the output of ADC 324, while the reference TX signal at the output of predistortion block 306 remains the same. Overall, during coarse timing correlation the TX signal may be downsampled by a factor 2, one of the phases (odd or even) may be selected, and the coarse correlation index may be determined.

Once coarse timing correlation has been performed, the phase that was selected for the TX signal for the coarse timing correlation may also be used for performing fine timing correlation. In the embodiment shown in FIG. 5, the output from ADC 324 may be provided to finite impulse response filters (FIR) 1134 and 1138, and to a fine-delay block 1140. A downsampled version of the digital TX signal may be provided to fine timing correlation blocks 1136a-1136c as the reference signal. The coefficients of polyphase filters 1134 and 1138 may be chosen to provide odd and even samples as if the output of single ADC 324 were upsampled by 2×. Thus, FIR filters 1134 and 1138 allow for fine-tuning by adjusting the signal in fractional steps, from odd to even phase or even to odd phase. Delay block 1140 may provide a means for delaying a whole step when applicable. In other words, fine timing correlator blocks 1136a . . . 1136c may perform the RX signal interpolation, and once the correct phase for the RX signal has been determined, the corresponding transmitter phase (odd or even), which would be time aligned with the output signal of ADC 324, may be selected. This may allow for shutting down FIR filter stages 1134 and 1138. Otherwise, the phase that was selected for the TX signal for the coarse timing correlation may be used while running the correct FIR filter (corresponding to the correct phase) to generate a fine timed RX signal.

The filter outputs from FIR 1134 and FIR 1138 may be correlated to the downsampled TX signal in fine timing correlation blocks 1136a and 1136b, respectively, and the result provided to fine timing decision block 1142, which may determine the final alignment and adjust delay buffer 314 accordingly. In other words, fine timing decision block 1142 may determine the correct phase (e.g. through decision logic) and inform programmable delay buffer 314 to select the correct TX phase (odd even samples). As previously mentioned, phase noise PA characteristics may be determined through the loopback path for both the analog TX and analog RX paths. Upconverter 610 and the downconverter 626 may be driven with the same oscillator 1118, facilitating correlation of the phase noise, which may cancel out in the loopback path. One advantage of the loopback path is the capability it provides to discern the phase irregularities within the complete analog chain, regardless of where the TX PA is configured, i.e. regardless of whether the TX PA is on the same IC as the rest of transmitter 300 or separate. Therefore, predistortion for transmitter 300 may be performed for the entire transmit path, not just for the PA itself.

The RX sampling rate may be determined by the operating frequency of ADC 324. As previously mentioned, the RX frequency may be lower than the TX frequency, which may be by design choice. A lower RX sampling frequency may allow for saving integrated circuit area, for example, and may well be compensated for in various design modifications. Overall, the choice of TX and RX frequencies may be determined based on various systems and operating considerations, and a number of different frequencies may be considered when designing transmitter 300. The predistortion training principles set forth herein may be equally applied to operating frequencies different from the specific valued in the disclosed embodiments.

More generally, the timing alignment during predistortion training may be performed through the use of a downsampler (e.g. block 318—which may be a simple decimator) to select samples (such as odd or even) for use in FIR filters 1134 and 1138, or in coarse timing correlator 1122. The goal is to accurately measure and compensate the processing delays, otherwise the predistortion calculation may be incorrect. Thus, the TX path may be downsampled when determining the programmable delay to be configured in delay buffer 314. If odd samples are selected initially (during coarse timing correlation), even samples may be selected for a more accurate predistortion calculation (fine timing correlation). If both the TX path and RX path featured the same sample rate, this may not be required. If the RX path featured twice the sampling rate of the TX path, similar downsampling may be performed in the RX path. Overall, the programmable delay set in delay buffer 314 may operate to adequately compensate for the processing delays. Furthermore, such compensation may be performed in either the TX path or the RX path, depending where such compensation may be relatively more convenient.

Referring again to FIG. 3, in one set of embodiments, a filter (not shown) may also be coupled between RX stage 328 and ADC 324, and controlled from FSM 302. During predistorter training the bandwidth of this filter may be broadened in order to not lose the non-linearities (side lobe information). That is, during predistorter training, the filter bandwidth may be relaxed to provide more accurate characterization. Predistorter 306 may also be configured to store different sets of coefficients for each gain setting, from which the appropriate set of coefficients may be selected during normal transmission. In one set of embodiments, during normal transmission RX stage 328 and other elements in the RX path may be turned off. The training/calibration may also be performed during normal operation from time to time, accounting for characteristic changes due to environmental factors, such as temperature. The loop between the output of TX stage 326 and the input of RX stage 328 may simply be closed, and the predistorter training may proceed. Dynamic training may also be performed during a regular transmission, by transmitting a regular packet during calibration.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for operating a transmitter, the method comprising:
  performing predistortion training, comprising:
    receiving a non-predistorted transmit (TX) signal;
    obtaining a first set of parameters comprising amplitude information and phase information representative of the TX signal;
    generating a TX radio frequency (RF) signal from the TX signal;
    amplifying the TX RF signal through a power amplifier (PA);
    obtaining a receive (RX) signal in a receiver path by applying the amplified TX RF signal as an input signal into the receiver path;
    obtaining a second set of parameters comprising amplitude information and phase information representative of the RX signal; and
    determining a transfer function of the PA from the first set of parameters and the second set of parameters.

2. The method of claim 1, wherein said performing predistortion training further comprises:

prior to said obtaining the second set of parameters:
correlating the RX signal to the TX signal to correct for phase errors between the TX signal and the RX signal; and
delaying the TX signal prior to said amplifying the TX, according to results of said correlating.

3. The method of claim 2, wherein said correlating comprises:
downsampling the TX signal; and
correlating the RX signal to the downsampled TX signal;
wherein said delaying the TX signal prior to said amplifying comprises delaying the TX signal according to results of said correlating the RX signal to the downsampled TX signal.

4. The method of claim 3, wherein said correlating further comprises:
subsequent to said delaying the TX signal according to the results of said correlating the RX signal to the downsampled TX signal:
upsampling the RX signal by a specified factor; and
correlating the upsampled RX signal to the TX signal; and
wherein said delaying the TX signal prior to said amplifying comprises delaying the TX signal according to results of said correlating the upsampled RX signal to the TX signal.

5. The method of claim 1, wherein said performing predistortion training further comprises:
determining first amplitude information and first phase information based on the transfer function of the PA;
wherein the method further comprises:
subsequent to said performing predistortion training:
receiving a second TX signal;
adjusting an amplitude of the second TX signal according to the first amplitude information; and
adjusting a phase of the second TX signal according to the first phase information.

6. The method of claim 5, wherein the method further comprises: subsequent to said adjusting the amplitude of the second TX signal and said adjusting the phase of the second TX signal:
generating a second TX RF signal from the amplitude and phase adjusted second TX signal.

7. The method of claim 5, further comprising transmitting the second TX RF signal.

8. A system comprising:
a predistorter block configured to:
receive a digital transmit (TX) signal;
when enabled, adjust amplitude and phase of the digital TX signal according to a set of predistorter values, and provide as its output signal the amplitude and phase adjusted digital TX signal; and
when disabled, provide as its output signal the digital TX signal;
a power amplifier configured to receive an analog TX signal obtained from the output signal of the predistorter block, and amplify the analog TX signal;
a receiver stage configured to switchably receive the amplified analog TX signal and generate a digital receive (RX) signal based on the amplified analog TX signal; and
a predistortion trainer block configured to determine the predistorter values based on the digital TX signal and the digital RX signal when the output signal of the predistorter block is the digital TX signal, and provide the predistorter values to the predistorter block;
wherein in adjusting the amplitude and phase of the digital TX signal according to the predistorter values, the predistorter block corrects amplitude and phase distortion introduced by the power amplifier.

9. The system of claim 8, further comprising:
a digital-to-analog converter (DAC) configured to convert the output signal of the predistorter block to an analog signal; and
an analog transmit path coupled between the DAC and the power amplifier, and configured to generate the analog TX signal from the analog signal;
wherein in adjusting the amplitude and phase of the digital TX signal according to the predistorter values, the predistorter block is configured to correct for amplitude and phase distortion introduced by the analog transmit path and the power amplifier.

10. The system of claim 9, further comprising:
an adjustable delay element coupled between the predistorter block and the DAC, and configured to delay the output signal of the predistorter block; and
a timing correlator block configured to:
correlate the digital RX signal to the digital TX signal, when the output signal of the predistorter block is the digital TX signal; and
adjust the delay element to delay the output signal of the predistorter block according to results of the correlation.

11. The system of claim 8, further comprising:
a first transform block configured to:
receive the digital TX signal;
obtain from the digital TX signal first amplitude and phase information representative of the digital TX signal;
and provide the first amplitude and phase information to the predistortion trainer block; and
a second transform block configured to: receive the digital RX signal; obtain from the digital RX signal second amplitude and phase information representative of the digital RX signal when the output signal of the predistorter block is the digital TX signal; and provide the second amplitude and phase information to the predistortion trainer block;
wherein the predistortion trainer block configured to determine the predistorter values based on the first amplitude and phase information and the second amplitude and phase information.

12. The system of claim 11, wherein the first transform block and the second transform blocks are both configured to implement a Coordinate Rotation Digital Computer algorithm.

13. The system of claim 8, wherein the predistorter block comprises:
a first converter configured to receive the digital TX signal and obtain amplitude and phase of the digital TX signal;
an amplitude predistorter configured adjust the magnitude of the digital TX signal according to the predistorter values; a phase predistorter configured to adjust the phase of the digital TX signal according to the predistorter values;
and a second converter configured to receive the adjusted magnitude and the adjusted phase, and generate the amplitude and phase adjusted digital TX signal based on the adjusted magnitude and the adjusted phase.

14. A transmitter for transmitting modulated signals and configured to operate in either a training mode or a transmission mode, the transmitter comprising:
a predistorter block configured to:
receive a digital baseband transmit (TX) signal;

adjust amplitude and phase of the digital baseband TX signal according to a set of predistorter values to adjust the digital baseband TX signal, and provide the adjusted digital baseband TX signal as a predistorter output, when operating in transmission mode; and provide the digital baseband TX signal as the predistorter output, when operating in training mode;

a digital-to-analog converter (DAC) configured to generate an analog baseband TX signal based on the predistorter output;

an upconverter configured to upconvert the analog baseband TX signal to a radio frequency (RF) TX signal;

a power amplifier configured to receive the RF TX signal, and amplify the RF TX signal to produce an output signal;

an attenuator configured to receive an RF receive (RX) signal, attenuate the RF RX signal, and output the attenuated RF RX signal, wherein the attenuator is configured to receive the amplified RF TX signal as the RF RX signal when operating in training mode;

a downconverter configured to downconvert the attenuated RF RX signal to an analog baseband RX signal; an analog-to-digital converter (ADC) configured to generate a digital baseband RX signal based on the analog baseband RX signal; and a predistortion trainer block configured to determine the predistorter values based on the digital baseband TX signal and the digital baseband RX signal, and provide the predistorter values to the predistorter block, when operating in training mode;

wherein in adjusting the amplitude and phase of the digital baseband TX signal according to the predistorter values, the predistorter block corrects amplitude and phase distortion introduced by the power amplifier.

15. The transmitter of claim 14, further comprising a variable gain amplifier (VGA) configured to amplify the baseband analog RX signal, wherein the ADC is configured to generate the digital baseband RX signal based on the amplified analog baseband RX signal.

16. The transmitter of claim 15, further comprising an automatic gain control element configured to adjust a gain of the VGA, based on the digital baseband RX signal.

17. The transmitter of claim 14, further comprising:
a programmable delay buffer coupled between the predistorter block and the DAC; and
a coarse timing correlation block configured to correlate the digital baseband RX signal to the digital baseband TX signal up to a first fraction of a sampling time of the ADC, and program the delay buffer according to results of the correlation, when operating in training mode.

18. The transmitter of claim 17, further comprising:
a set of fine timing correlation blocks configured to correlate the digital baseband RX signal to the digital baseband TX signal up to a second fraction of the sampling time of the ADC, wherein the second fraction is smaller than the first fraction.

19. The transmitter of claim 17, further comprising:
a set of interpolation filters, each filter of the set of interpolation filters coupled to a respective fine timing correlation block of the e set of fine timing correlation blocks, and configured to interpolate the digital baseband RX signal.

20. The transmitter of claim 19, further comprising:
a fine timing decision block configured to determine a correct phase and delay based on a respective output from each fine timing correlation block of the set of fine timing correlation blocks, and program the delay buffer according to the correct phase and delay.

* * * * *